(12) United States Patent
Niwa

(10) Patent No.: US 8,946,852 B2
(45) Date of Patent: Feb. 3, 2015

(54) PHOTOSENSITIVE RESIN COMPOSITION, PHOTOSENSITIVE RESIN COMPOSITION FILM, AND SEMICONDUCTOR DEVICE USING THE PHOTOSENSITIVE RESIN COMPOSITION OR PHOTOSENSITIVE RESIN COMPOSITION FILM

(75) Inventor: Hiroyuki Niwa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 44 days.

(21) Appl. No.: 13/807,210

(22) PCT Filed: Jun. 10, 2011

(86) PCT No.: PCT/JP2011/063339
§ 371 (c)(1),
(2), (4) Date: Feb. 25, 2013

(87) PCT Pub. No.: WO2012/002134
PCT Pub. Date: Jan. 5, 2012

(65) Prior Publication Data
US 2013/0214379 A1    Aug. 22, 2013

(30) Foreign Application Priority Data

Jul. 2, 2010   (JP) .................. 2010-151596

(51) Int. Cl.
G03F 7/023    (2006.01)
H01L 23/00    (2006.01)
H01L 23/29    (2006.01)

(52) U.S. Cl.
USPC ............... 257/499; 430/280.1; 156/272.2; 524/190

(58) Field of Classification Search
USPC ............... 524/186, 190; 257/499; 430/280.1; 156/272.2
See application file for complete search history.

(56) References Cited

U.S. PATENT DOCUMENTS

| 5,442,024 A * | 8/1995 | Kunimune et al. ............. 528/12 |
| 2004/0235992 A1 * | 11/2004 | Okada et al. .................. 524/115 |
| 2008/0193718 A1 | 8/2008 | Suwa et al. |
| 2009/0075198 A1 | 3/2009 | Nomura |
| 2009/0123867 A1 | 5/2009 | Yuba et al. |
| 2009/0166818 A1 | 7/2009 | Banba et al. |
| 2010/0035182 A1 | 2/2010 | Tanaka et al. |

FOREIGN PATENT DOCUMENTS

| CN | 1930522 A | 3/2007 |
| CN | 101213491 A | 7/2008 |
| CN | 10322073 A | 12/2008 |
| JP | 04-337380 A | 11/1992 |
| JP | 2006-313237 A | 11/2006 |

(Continued)

OTHER PUBLICATIONS

Machine translation of JP 2010-085673. Apr. 2010.*
Supplementary European Search Report, dated Jul. 22, 2013, application No. EP11800602.
Seiichi Denda, "TSV Technique for Three-dimensional Mounting" (2009).

(Continued)

Primary Examiner — John Uselding
(74) Attorney, Agent, or Firm — Ratnerprestia

(57) ABSTRACT

A photosensitive resin composition contains: (a) an alkali-soluble polyimide; (b) a compound which has two or more epoxy groups and/or oxetanyl groups in each molecule; and (c) a quinonediazide compound. Less than 10 parts by weight of an acrylic resin is contained per 100 parts by weight of the polyimide (a); and the content of the compound (b) is not less than 20 parts by weight per 100 parts by weight of the polyimide (a).

15 Claims, 1 Drawing Sheet

(56) References Cited

FOREIGN PATENT DOCUMENTS

| | | | |
|---|---|---|---|
| JP | 2008-197181 | A | 8/2008 |
| JP | 2008-281597 | A | 11/2008 |
| JP | 2008-286877 | A | 11/2008 |
| JP | 2009-020246 | A | 1/2009 |
| JP | 2009-068002 | A | 4/2009 |
| JP | 2009-300578 | | 12/2009 |
| JP | 2010-085673 | A | 4/2010 |
| WO | WO2010-047271 | A1 | 4/2010 |

OTHER PUBLICATIONS

International Search Report dated Jul. 12, 2011, application No. PCT/JP2011/063339.
Korean Office Action for Corresponding Korean Patent Application No. 10-2012-7033051 Citing Japanese Document JP200900578, Apr. 18, 2013.
Chinese Office Action for Corresponding Chinese Patent Application No. 201180031004.0, Citing Chinese References and Issued Jun. 4, 2014.

* cited by examiner (a) 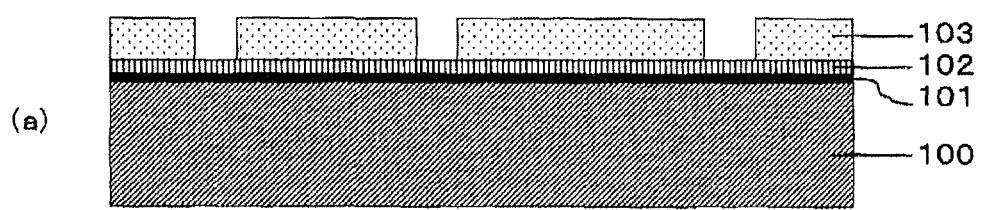
(b) 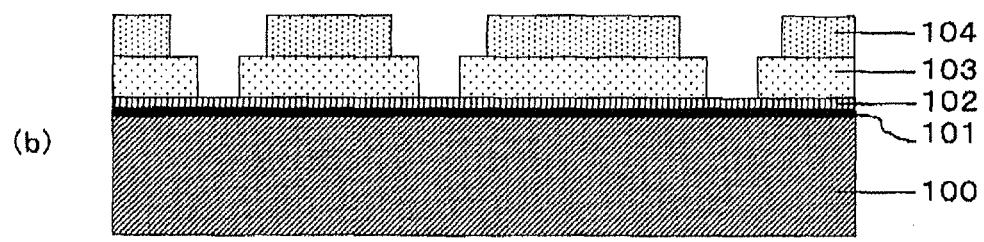
(c) 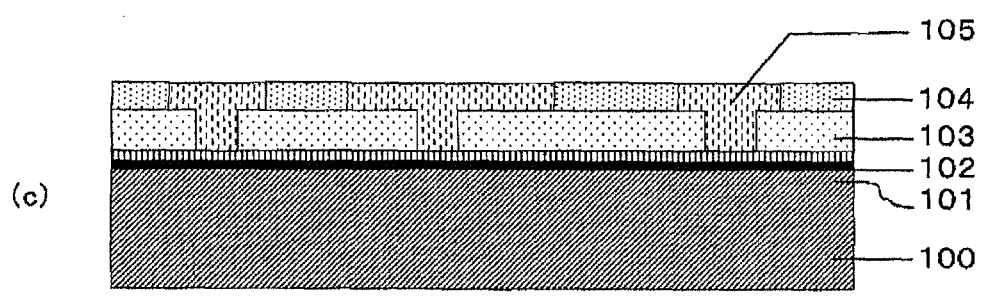

PHOTOSENSITIVE RESIN COMPOSITION, PHOTOSENSITIVE RESIN COMPOSITION FILM, AND SEMICONDUCTOR DEVICE USING THE PHOTOSENSITIVE RESIN COMPOSITION OR PHOTOSENSITIVE RESIN COMPOSITION FILM

CROSS REFERENCE TO RELATED APPLICATIONS

This application is the U.S. National Phase application of PCT International Application No. PCT/JP2011/063339, filed Jun. 10, 2011, and claims priority to Japanese Patent Application No. 2010-151596, filed Jul. 2, 2010, the disclosures of each of these applications are incorporated herein by reference in their entireties for all purposes.

FIELD OF THE INVENTION

The present invention relates to a photosensitive resin composition and a photosensitive resin composition film. More particularly, the present invention relates to a photosensitive composition that is used for a semiconductor element, a semiconductor device having multilayer structure, a photosensitive composition such as an image sensor and so on, particularly a photosensitive resin composition having an adhesion function.

BACKGROUND OF THE INVENTION

In recent years, various forms of packages have been proposed for achieving improvement of performance of a semiconductor device and electronic components, and cost reduction. For example, a method is known in which the periphery of an element is surrounded by a resin spacer having adhesion, and a substrate such as glass is attached to the upper surface to form a hollow structure for forming a hollow package such as an image sensor or an HEMS (see, for example, Patent Document 1). In such an application, an adhesive, which allows patterning by photolithography, is required.

As the size is reduced, the operation speed is increased and the density of wiring is increased particularly in semiconductor devices such as memories and system LSIs, studies are constantly conducted on practical applications of a semiconductor package of three-dimensional structure in which silicon chips are each provided on both the front and rear surfaces with an electrode structure such as a pad and a bump by a through via, rather than connection by conventional wire bonding, and laminated together to secure conduction between chips (see Non-patent Document 1). In a package having such a structure, the use of an adhesive for laminating the chips is contemplated. The adhesive used here preferably has such a photosensitivity that an adhesive on an electrode can be removed by patterning for exposing an electrode part to secure conduction between chips, in addition to properties prerequisite for assembly reliability such as a low stress property, adhesion, an insulating property and such a heat resistance that reflow soldering can be endured.

Materials using a polyimide precursor are known as adhesives having a photosensitivity and a high heat resistance (see, for example, Patent Document 2), but these materials are required to be heat-cured at a high temperature of 300° C. or higher for a ring-closure reaction to form the polyimide. Thus, there is a concern that thermal stress associated with cure shrinkage is so large that the substrate is warped and the adhesion strength is reduced. For solving these problems, there has been proposed a negative tone photosensitive material, the curing temperature of which is reduced by using an alkali-soluble polyimide as a base resin (see, for example, Patent Document 3). A positive tone photosensitive material, which can be cured at a low temperature similarly by using an alkali-soluble polyimide as a base resin, is also known (see, for example, Patent Documents 4 and 5).

PATENT DOCUMENTS

Patent Document 1: Japanese Patent Laid-open Publication No. 2008-286877
Patent Document 2: Japanese Patent Laid-open Publication No. 04-337380
Patent Document 3: Japanese Patent Laid-open Publication No. 2008-281597
Patent Document 4: Japanese Patent Laid-open Publication No. 2006-313237
Patent Document 5: Japanese Patent Laid-open Publication No. 2009-20246

NON-PATENT DOCUMENT

Non-patent Document 1: Seiichi Denda, "TSV Technique for Three-dimensional Mounting" (2009)

SUMMARY OF THE INVENTION

In the resin design described in Patent Document 3, an alkali-soluble polyimide has high thermal stress, and exhibits an insufficient thermocompression property to a support substrate such as a silicon wafer or a glass substrate in some cases. Further, the material is a negative tone photosensitive material, and the pattern shape tends to be an inverse tapered shape. Thus, there is such a problem that defects such as collapse of a pattern occurs, or it is difficult to form a sputtered film for the purpose of formation of wiring on the side wall of the pattern. On the other hand, the positive tone photosensitive materials described in Patent Documents 4 and 5 do not have a sufficient adhesion function, and are difficult to be formed into a B stage sheet and used because a film after drying off a solvent is fragile.

The present invention provides a positive tone photosensitive resin composition and photosensitive resin composition film, each of which has small stress after curing and exhibits excellent adhesion.

The present invention, according to one exemplary embodiment, is a photosensitive resin composition containing: (a) an alkali-soluble polyimide which has a structural unit represented by general formula (1), while having a structure represented by general formula (2) and/or (3) at least one end of the main chain; (b) a compound which has two or more epoxy groups and/or oxetanyl groups in each molecule; and (c) a naphthoquinonediazide compound, wherein the content of the compound (b) is not less than 20 parts by weight per 100 parts by weight of the polyimide (a).

According to the present invention, there is obtained a photosensitive resin composition and a photosensitive resin composition film, each of which is capable of forming a positive tone pattern by photolithography, has small stress after curing, and exhibits a high strength of adhesion with a semiconductor element and a support member.

BRIEF DESCRIPTION OF THE DRAWINGS

FIG. 1 shows a multilayer wiring substrate prepared using a photosensitive resin composition of an embodiment of the present invention.

DETAILED DESCRIPTION OF EMBODIMENTS OF THE INVENTION

A photosensitive resin composition of an embodiment of the present invention contains (a) an alkali-soluble polyimide which has a structural unit represented by general formula (1), while having a structure represented by general formula (2) and/or (3) at least one end of the main chain; (b) a compound which has two or more epoxy groups and/or oxetanyl groups in each molecule; and (c) a naphthoquinonediazide compound, wherein the content of the compound (b) is not less than 20 parts by weight per 100 parts by weight of the polyimide (a).

The polyimide as component (a) is an alkali-soluble polyimide. The term "alkali-soluble" used herein means that the solubility in a 2.38% aqueous tetramethyl ammonium hydroxide solution is not less than 0.1 g/100 mL. For exhibiting an alkali-solubility and allowing good pattern processing, the polyimide as component (a) has a structural unit represented by general formula (1) below, while having a structure represented by general formula (2) and/or (3) at least one end of the main chain.

[Chemical Formula 1]

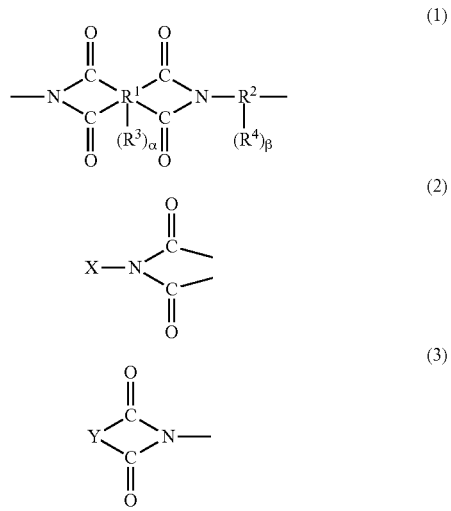

In the formula, X represents a monovalent organic group having at least one selected from the group consisting of a carboxyl group, a phenolic hydroxyl group, a sulfonic acid group and a thiol group, and Y represents a divalent organic group having at least one selected from the group consisting of a carboxyl group, a phenolic hydroxyl group, a sulfonic acid group and a thiol group. X is preferably an aromatic group, and Y is preferably an aromatic group, or a group having a carbon-carbon double bond. Particularly, X and Y preferably have a phenolic hydroxyl group or a thiol group.

$R^1$ represents a tetra- to tetradeca-valent organic group, $R^2$ represents a di- to dodeca-valent organic group, and $R^3$ and $R^4$ each independently represent at least one group selected from the group consisting of a carboxyl group, a phenolic hydroxyl group, a sulfonic acid group and a thiol group. α and β each independently represent an integer of 0 to 10.

In general formula (1) above, $R^1$ represents a structural component derived from a tetracarboxylic dianhydride. Particularly, it is preferably an organic group containing an aromatic group or a cyclic aliphatic group and having 5 to 40 carbon atoms.

Specific examples of the tetracarboxylic dianhydride include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 9,9-bis(3,4-dicarboxyphenyl)fluorensic dianhydride, 9,9-bis{4-(3,4-dicarboxyphenoxy)phenyl}fluorensic dianhydride, 2,3,6,7-naphthalenetetracarboxylic dianhydride, 2,3,5,6-pyridinetetracarboxylic dianhydride, 3,4,9,10-perylenetetracarboxylic dianhydride and 2,2-bis(3,4-dicarboxyphenyl)hexafluoropropane dianhydride, aliphatic tetracarboxylic dianhydrides such as butanetetracarboxylic dianhydride and 1,2,3,4-cyclopentanetetracarboxylic dianhydride, and acid dianhydrides having a structure shown below. They are used alone or in combination of two or more thereof.

[Chemical Formula 2]

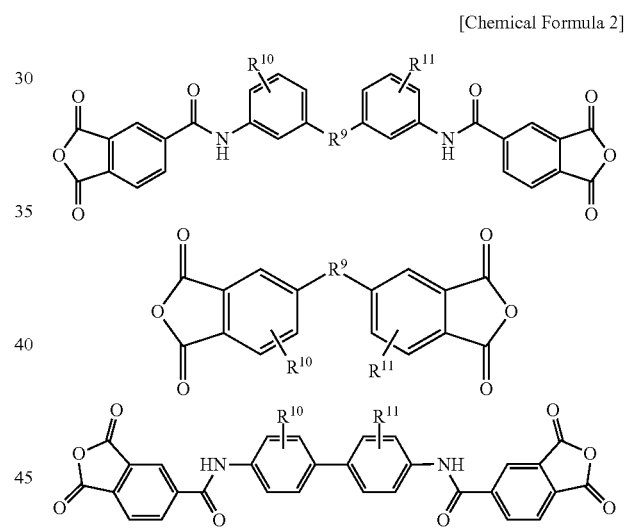

Here, $R^9$ represents a group selected from an oxygen atom, $C(CF_3)_2$, $C(CH_3)_2$, CO, COO and $SO_2$, and $R^{10}$ and $R^{11}$ each represent a group selected from a hydrogen atom, a hydroxyl group and a thiol group.

In general formula (1) above, $R^2$ represents a structural component derived from a diamine. Particularly, it is preferably an organic group containing an aromatic group or a cycloaliphatic group and having 5 to 40 carbon atoms.

Specific examples of the diamine include 3,3'-diaminodiphenyl ether, 3,4'-diaminodiphenyl ether, 4,4'-diaminodiphenyl ether, 3,3'-diaminodiphenyl methane, 3,4'-diaminodiphenyl methane, 4,4'-diaminodiphenyl methane, 3,3'-diaminodiphenyl sulfone, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, 1,3-bis(4-aminophenoxy)benzene, 1,3-bis(3-aminophenoxy)benzene, benzidine, m-phenylenediamine, p-phenylenediamine, 1,5-naphthalenediamine, 2,6-naphthalanediamine, bis(4-aminophenoxyphenyl)sulfone, bis(3- aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene or compounds with the aromatic ring of the above-mentioned compound substituted with an alkyl group or a halogen atom, aliphatic cyclohexyldiamine, methylenebiscyclohexylamine, and diamines having a structure shown below. They are used alone or in combination of two or more thereof.

[Chemical Formula 3]

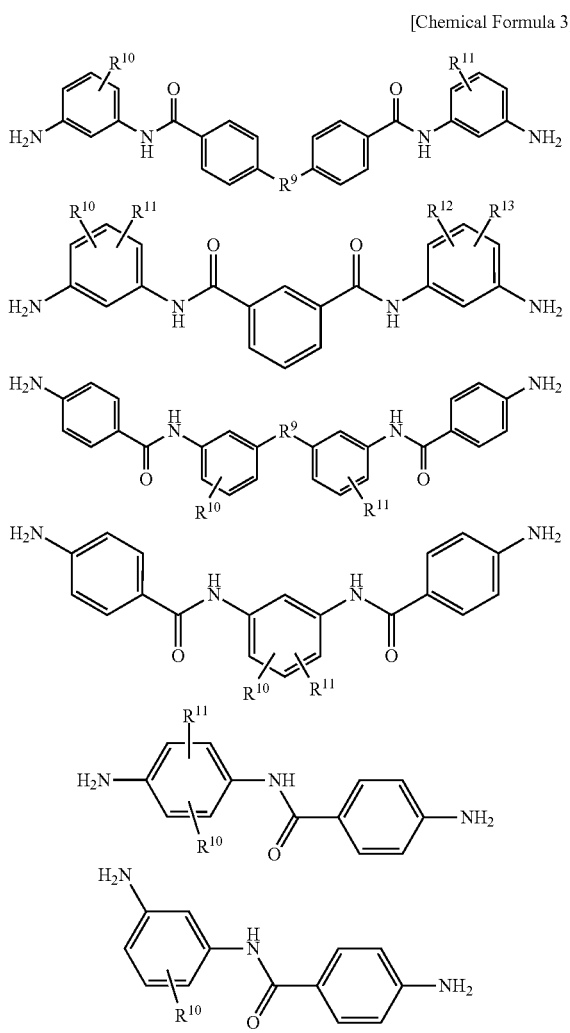

Here, $R^9$ represents a group selected from an oxygen atom, $C(CF_3)_2$, $C(CH_3)_2$, CO, COO and $SO_2$, and $R^{10}$ and $R^{13}$ each represent a group selected from a hydroxyl group and a thiol group.

Among them, 3,3'-diaminodiphenyl ether, 3,4'-diaminodiphenyl ether, 4,4'-diaminodiphenyl ether, 3,3'-diaminodiphenyl methane, 3,4'-diaminodiphenyl methane, 4,4'-diaminodiphenyl methane, 3,3'-diaminodiphenyl sulfone, 3,4'-diaminodiphenyl sulfone, 4,4'-diaminodiphenyl sulfone, 3,3'-diaminodiphenyl sulfide, 4,4'-diaminodiphenyl sulfide, m-phenylenediamine, p-phenylenediamine, 1,4-bis(4-aminophenoxy)benzene, 9,9-bis(4-aminophenyl)fluorene, diamines having a structure shown below, and so on are preferable.

[Chemical Formula 4]

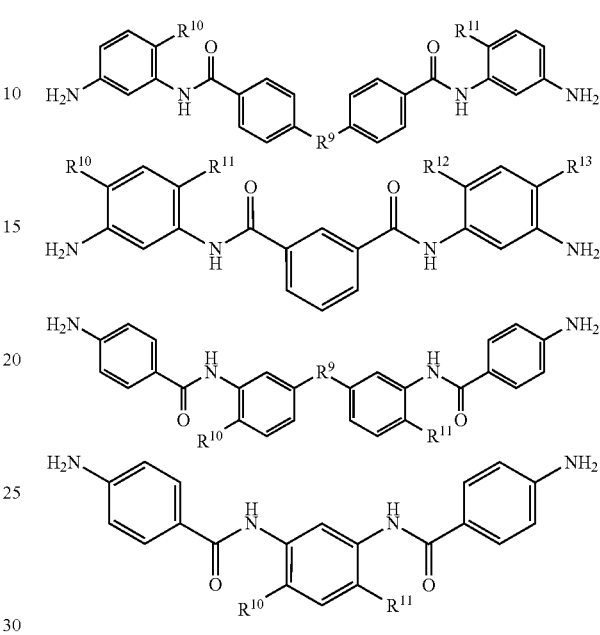

$R^9$ represents a group selected from an oxygen atom, $C(CF_3)_2$, $C(CH_3)_2$, and $SO_2$, and $R^{10}$ and $R^{13}$ each represent a group selected from a hydroxyl group and a thiol group.

In general formula (1), $R^3$ and $R^4$ each independently represent at least one selected from the group consisting of a carboxyl group, a phenolic hydroxyl group, a sulfonic acid group and a thiol group. By adjusting the amounts of $R^3$ and $R^4$, the rate of dissolution of the polyimide in an aqueous alkali solution is changed, so that a photosensitive resin composition having an appropriate dissolution rate can be obtained.

Further, for improving adhesion with a substrate, and so on, an aliphatic group having a siloxane structure may be copolymerized with $R^2$ within the bounds of not reducing the heat resistance. Specific examples of the diamine component include those obtained by copolymerizing 1 to 10 mol % of bis(3-aminopropyl)tetramethyl disiloxane, bis(p-amino-phenyl)octamethyl pentasiloxane and so on.

General formulae (2) and (3) show the structure of the end of a polyimide having a structural unit represented by general formula (1). The polyimide have two ends, at least one of which should have a structure represented by general formula (2) and/or (3).

A polyimide having a structure represented by general formula (2) and/or (3) at the end of the main chain can be synthesized using a publicly known method with a part of a diamine replaced by a monoamine which is an end capping agent, or with a tetracarboxylic dianhydride replaced by a dicarboxylic anhydride which is an end capping agent. A polyimide precursor is obtained by, for example, a method in which a tetracarboxylic dianhydride, a diamine compound and a monoamine are reacted at a low temperature, a method in which a tetracarboxylic dianhydride, a dicarboxylic anhydride and a diamine compound are reacted at a low temperature, or a method in which a diester is obtained by a tetracarboxylic dianhydride and an alcohol, and then reacted with a diamine and a monoamine in the presence of a condensation agent. Thereafter, a polyimide can be synthesized by imidizing the obtained polyimide precursor by a publicly known imidization reaction.

In general formula (2), X is derived from a primary monoamine which is an end capping agent. As the primary monoamine used as an end capping agent, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol and so on are preferable. They are used alone or in combination of two or more thereof.

In general formula (3), Y is derived from a dicarboxylic anhydride which is an end capping agent. As the acid anhydride used as an end capping agent, 4-carboxyphthalic anhydride, 3-hydroxyphthalic anhydride, cis-aconitic anhydride and so on are preferable. They are used alone or in combination of two or more thereof.

The polyimide, which has a structural unit represented by general formula (1), while having a structure represented by general formula (2) and/or (3) at least one of the ends of the main chain, may be one having a repeating unit consisting of only the structural unit represented by general formula (1), or may be a copolymer with other structural units, or may include a precursor of the structural unit represented by general formula (1) (polyamic acid structure). At this time, the structural unit represented by general formula (1) is preferably contained in an amount of no less than 50 mol % of the total amount of the polyimide. The type and the amount of a structural unit used for copolymerization or mixing are preferably selected within the bounds of not deteriorating the heat resistance of a polyimide obtained by a final heating treatment.

The imidization ratio of the polyimide (a) can be easily determined by the following method. Here, the imidization ratio means a mole percentage of a polyimide precursor converted into a polyimide in synthesis of a polyimide through a polyimide precursor as described above. First, the infrared spectrum of a polyimide precursor is measured, and the presence of absorption peaks (around 1780 cm$^{-1}$ and around 1377 cm$^{-1}$) originating from a polyimide is confirmed. Next, the polyimide precursor is subjected to a heat treatment at 350° C. for an hour, the infrared spectrum is then measured again, and peak intensities around 1377 cm$^{-1}$ before and after the heat treatment are compared. The imidization ratio of the polymer before the heat treatment is determined with the imidization ratio of the polymer after the heat treatment set to 100%. The imidization ratio of the polyimide (a) is preferably not less than 90%.

The end capping agent introduced into the polyimide (a) can be detected by the following method. For example, a polyimide, into which an end capping agent is introduced, is dissolved in an acidic solution to be decomposed into an amine component and a carboxylic anhydride component that are constituent units of the polyimide, and these components are analyzed by gas chromatography (GC) or NMR. Alternatively, a polyimide, into which an end capping agent is introduced, is directly analyzed using a pyrolysis gas chromatograph (PGC) or an infrared spectrum and a $^{13}$CNMR spectrum.

It is desirable that the weight average molecular weight of the polyimide (a) should be 10000 to 100000 inclusive. When two or more types of polyimides are contained, the weight average molecular weight of at least one thereof is preferably in the range described above. If the weight average molecular weight is less than 10000, the mechanical strength may significantly decrease, leading to a reduction in adhesion strength. The weight average molecular weight is preferably not less than 12000. On the other hand, the weight average molecular weight is more than 100000, the solubility in an alkali development liquid may decrease, leading to occurrence of development residues. The weight average molecular weight is preferably not more than 50000. The weight average molecular weight in the present invention is measured by gel permeation chromatography (GPC), and calculated in terms of polystyrene.

The photosensitive resin composition of the present invention preferably contains (b) a compound having two or more epoxy groups and/or oxetanyl groups in each molecule, wherein the compound (b) is a compound having two or more epoxy groups. Examples of the compound having two or more epoxy groups in each molecule include a bisphenol A-type epoxy compound, a bisphenol F-type epoxy compound, a novolac-type epoxy compound, a biphenol-type epoxy compound, a biphenyl-type epoxy compound, a glycidyl amine-type epoxy compound and a cyclic aliphatic epoxy compound. Specific examples include "jER (registered trademark)" 828, 834, 1001, 1002, 1003, 1004, 1005, 1007, 1010, 1100L, 630, ESCN-220L, 220F, 220H, 220HH, 180H65, 1032H60, YX4000H, 152, 157S70 and 1031 (Mitsubishi Chemical Corporation), "Epolite" 40E, 100E, 200E, 400E, 70P, 200P, 400P, 1500NP, 80MF, 4000 and 3002 (manufactured by Kyoeisha Chemical Co., Ltd), "ADEKA RESIN (registered trademark)" EP-4000S and EP-4003S (manufactured by ADEKA Corporation), "Denacol" EX-212L, EX-214L, EX-216L, EX-850L and EX-321L (manufactured by Nagase ChemteX Corporation), "EPICLON (registered trademark)" 850, EXA-850CRP, 860 and EXA-4701 (manufactured by DIC Corporation), "TEPIC" S, G and P (manufactured by Nissan Chemical Industries, Ltd.), and GAN, GOT, EPPN502H, NC3000 and NC6000 (manufactured by Nippon Kayaku Co., Ltd.). Specific examples of the compound having two or more oxetanyl groups in each molecule include OXT-121, OXT-221, OX-SQ-H, OXT-191, PNOX-1009 and RSOX (manufactured by Toagosei Co., Ltd.), and "ETERNACOLL" OXBP and OXTP (manufactured by UBE INDUSTRIES, LTD.).

For securing the adhesion strength and the fluidity during thermocompression, and reducing stress of a cured film, the content of the compound (b) should be not less than 20 parts by weight, more preferably not less than 40 parts by weight, per 100 parts by weight of the polyimide (a). The content of the compound (b) is preferably not more than 100 parts by weight per 100 parts by weight of the polyimide (a) from the viewpoint of the heat resistance and development characteristic.

The photosensitive resin composition of the present invention preferably contains a naphthoquinonediazide compound (c). The naphthoquinonediazide compound used is not particularly limited, but one example is a compound with a naphthoquinonediazidesulfonic acid ester-bonded to a compound having a phenolic hydroxyl group. As the compound having a phenolic hydroxyl group, a compound having two or more phenol cores in each molecule is preferably used. The naphthoquinonediazide compound can be synthesized by a publicly known esterification reaction of a compound having a phenolic hydroxyl group and a naphthoquinonediazidesulfonic acid chloride.

Specific examples of the compound having a phenolic hydroxyl group include the following compounds (all manufactured by Honshu Chemical Industry Co., Ltd.).

[Chemical Formula 5]

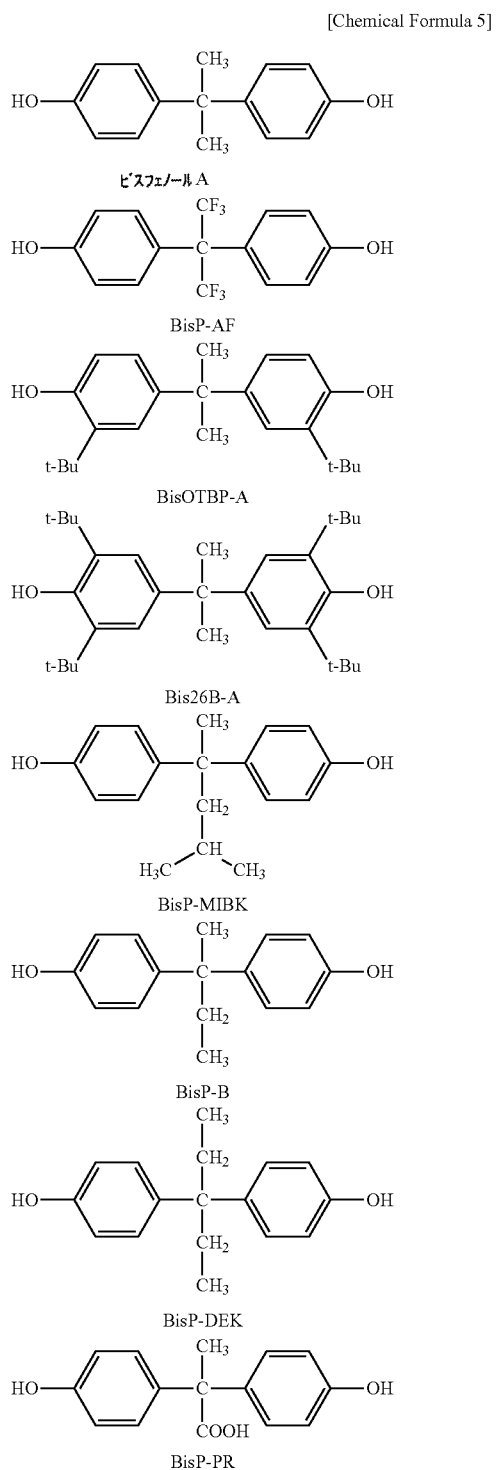

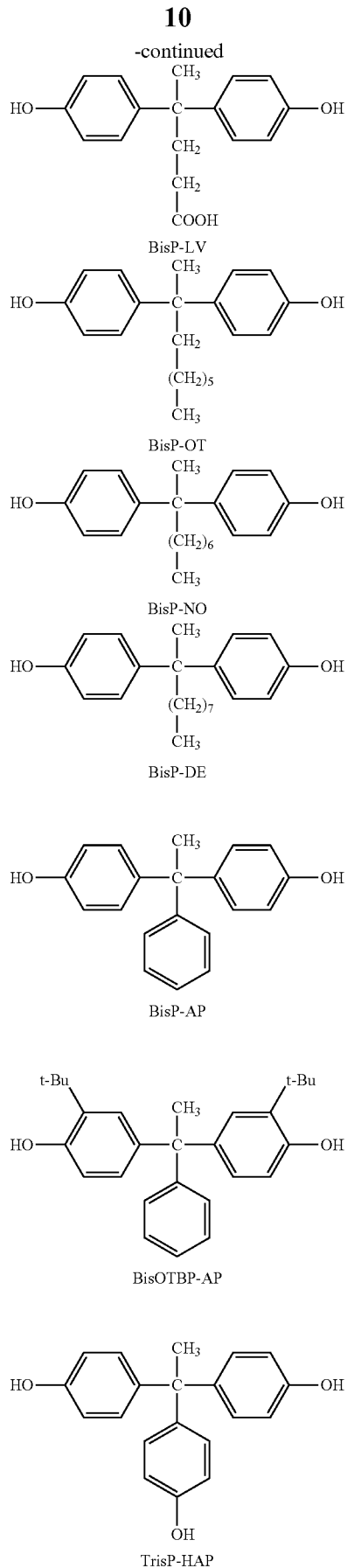

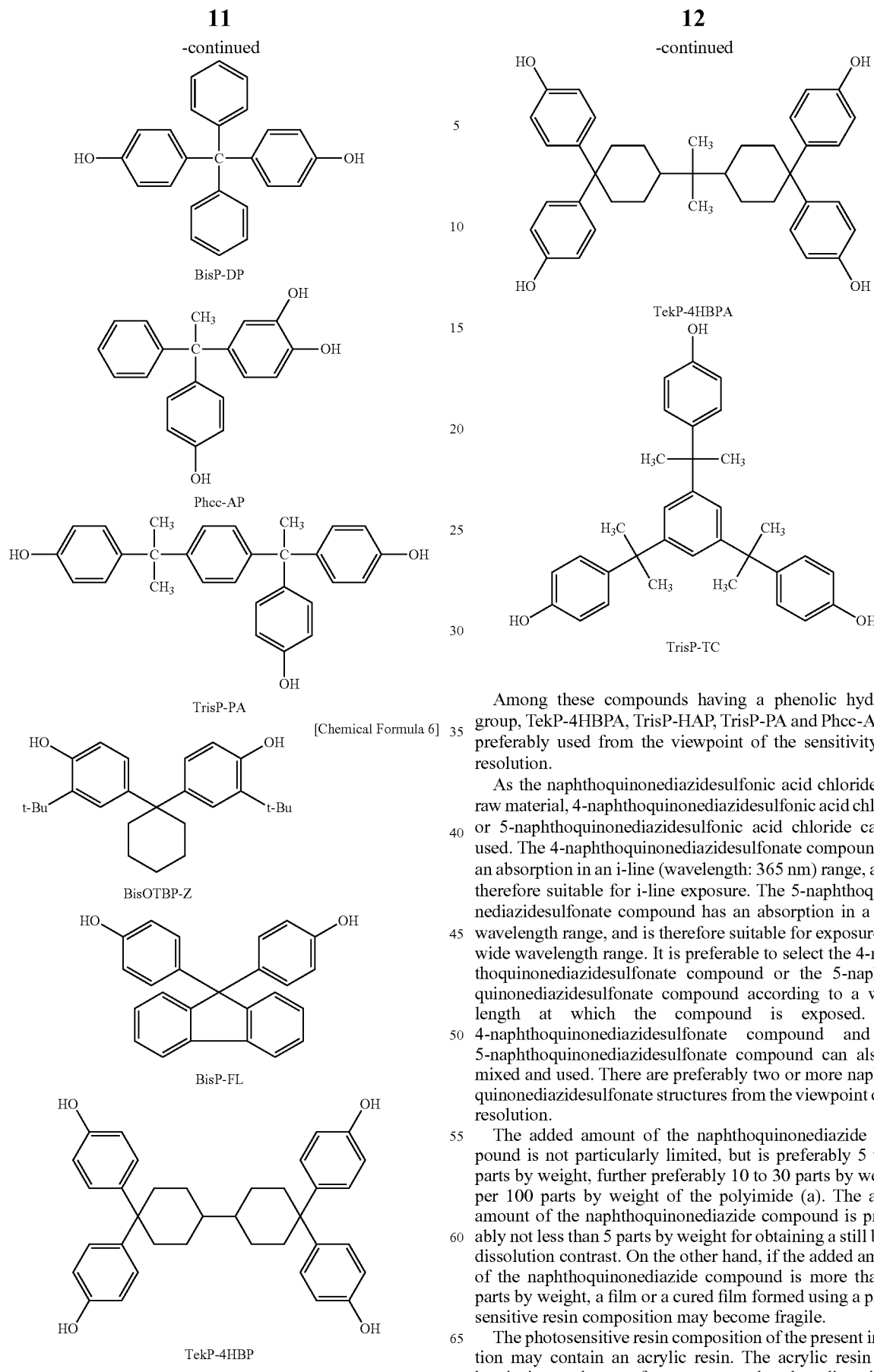

Among these compounds having a phenolic hydroxyl group, TekP-4HBPA, TrisP-HAP, TrisP-PA and Phcc-AP are preferably used from the viewpoint of the sensitivity and resolution.

As the naphthoquinonediazidesulfonic acid chloride as a raw material, 4-naphthoquinonediazidesulfonic acid chloride or 5-naphthoquinonediazidesulfonic acid chloride can be used. The 4-naphthoquinonediazidesulfonate compound has an absorption in an i-line (wavelength: 365 nm) range, and is therefore suitable for i-line exposure. The 5-naphthoquinonediazidesulfonate compound has an absorption in a wide wavelength range, and is therefore suitable for exposure in a wide wavelength range. It is preferable to select the 4-naphthoquinonediazidesulfonate compound or the 5-naphthoquinonediazidesulfonate compound according to a wavelength at which the compound is exposed. The 4-naphthoquinonediazidesulfonate compound and the 5-naphthoquinonediazidesulfonate compound can also be mixed and used. There are preferably two or more naphthoquinonediazidesulfonate structures from the viewpoint of the resolution.

The added amount of the naphthoquinonediazide compound is not particularly limited, but is preferably 5 to 40 parts by weight, further preferably 10 to 30 parts by weight, per 100 parts by weight of the polyimide (a). The added amount of the naphthoquinonediazide compound is preferably not less than 5 parts by weight for obtaining a still better dissolution contrast. On the other hand, if the added amount of the naphthoquinonediazide compound is more than 40 parts by weight, a film or a cured film formed using a photosensitive resin composition may become fragile.

The photosensitive resin composition of the present invention may contain an acrylic resin. The acrylic resin used herein is a polymer of an unsaturated carboxylic acid, an unsaturated carboxylate or the like, which is the acrylic resin described in Japanese Patent Laid-open Publication No. 2009-20246, and so on. However, if the acrylic resin is contained in a large amount, the heat stability is degraded at 250° C. or higher, so that the reliability is impaired. In addition, the film after drying off a solvent becomes fragile, so that it is very difficult to form the composition into a B stage film. In this respect, the content of the acrylic resin is preferably less than 10 parts by weight per 100 parts by weight of the polyimide (a), and preferably substantially no acrylic resin is contained particularly when the photosensitive resin composition of the present invention is used as a film.

The photosensitive resin composition of the present invention may contain a surfactant, inorganic particles such as silicon dioxide and titanium dioxide, additives such as a crosslinker, a crosslinking accelerator, a sensitizer, a dissolution adjustor, a stabilizer and an anti-foaming agent, a silane coupling agent, a titanium chelating agent, a zirconia chelating agent and so on.

It is preferable to add an organic solvent to the photosensitive resin composition of the present invention. The organic solvent used should be one that is capable of dissolving or dispersing the components.

Specific examples of the organic solvent include ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether and ethylene glycol dibutyl ether; acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate and butyl lactate; ketones such as acetone, methyl ethyl ketone, acetylacetone, methyl propyl ketone, methyl butyl ketone, methyl isobutyl ketone, cyclopentanone and 2-heptanone; alcohols such as butyl alcohol, isobutyl alcohol, pentanol, 4-methyl-2-pentanol, 3-methyl-2-butanol, 3-methyl-3-methoxybutanol and diacetone alcohol; aromatic hydrocarbons such as toluene and xylene; and others such as N-methyl-2-pyrrolidone, N-cyclohexyl-2-pyrrolidone, N,N-dimethylformamide, N,N-dimethylacetamide, dimethylsulfoxide and γ-butyrolactone.

The photosensitive resin composition may be filtered using a filter paper or a filter. The method for filtration is not limited, but mention is made of a method of filtering the composition by filtration under pressure using a membrane filter with a retention particle diameter of 0.2 μm to 10 μm.

For the photosensitive resin composition of the present invention, the shape before curing is not limited, and mention is made of, for example, a varnish shape and a film shape. The film shape may be a shape of a sheet formed on a support. When the composition is used in the varnish shape, a solution obtained by dissolving in an organic solvent the components (a) to (c) and components added as necessary can be used. A photosensitive resin composition film is obtained by applying the photosensitive resin composition of the present invention onto a support, and then drying the applied composition as necessary.

A laminate of the present invention preferably has a support, the photosensitive resin composition film of the present invention and a cover film in this order. The photosensitive resin composition film of the present invention is preferably formed on a support. The support used in the laminate of the present invention is not particularly limited, but various kinds of films that are usually commercially available, such as a polyethylene terephthalate (PET) film, a polyethylene film, a polypropylene (PP) film, a polyphenylene sulfide film and a polyimide film, can be used. The surface of the support may be treated with silicone, a silane coupling agent, an aluminum chelating agent, polyurea and so on for adjusting a wetting property, an adhesion property and a release property with the photosensitive resin composition. The thickness of the support is not particularly limited, but is preferably in a range of 10 to 100 μm from the viewpoint of a working property.

The photosensitive resin composition film of the present invention may have a cover film on the photosensitive resin composition film for protecting the surface. Examples of the cover film include a polyethylene film, a polypropylene (PP) film and a polyester film. The cover film has preferably a low adhesion force with a photosensitive adhesive film.

Examples of the method for forming the laminate of the present invention include a method in which the photosensitive resin composition of the present invention is applied onto a film of a support, and dried, and a cover film is laminated to the surface of the photosensitive resin composition film.

Examples of the method for applying the photosensitive resin composition to the support include spin coating using a spinner, spray coating, roll coating, screen printing, blade coating, die coating, calender coating, meniscus coating, bar coating, comma roll coating, gravure coating, and slit die coating. The coating film thickness varies depending on the coating method, the solid concentration of the composition, the viscosity and so on, but normally the film thickness after drying is preferably 0.5 μm to 80 μm inclusive.

For drying, an oven, a hot plate, an infrared oven or the like can be used. The drying temperature and the drying time should be in a range which allows an organic solvent to be volatilized, and it is preferable to appropriately conditions which ensure that the photosensitive resin composition film is in an uncured or semi-cured state. Specifically, drying is preferably carried out at a temperature in a range of 40° C. to 120° C. for one minute to several tens of minutes. These temperatures may be combined to elevate the temperature, and for example, a heat treatment may be carried out at 70° C., 80° C. and 90° C. for one minute for each temperature.

An exemplary method for pattern-processing the photosensitive resin composition of the present invention and the photosensitive resin composition film using the same, and an exemplary method for thermocompression to other members will now be described by showing an example.

First, a photosensitive resin composition coating is formed on a substrate using the photosensitive resin composition of the present invention and the photosensitive resin composition film using the same. The photosensitive resin composition is applied onto a substrate, and dried as necessary, whereby a coating can be formed. Examples of the coating method include spin coating using a spinner, spray coating, roll coating and screen printing. The coating film thickness varies depending on the coating method, the solid concentration of the resin composition, the viscosity and so on, but normally it is preferable to apply the composition so that the film thickness after drying is 0.5 μm to 80 μm inclusive. For drying, an oven, a hot plate, an infrared oven or the like can be used. The drying temperature and the drying time should be in a range which allows an organic solvent to be volatilized, and it is preferable to appropriately set a range which ensures that the photosensitive resin composition coating is in an uncured or semi-cured state. Specifically, drying is preferably carried out at a temperature in a range of 50° C. to 150° C. for one minute to several hours.

On the other hand, if the photosensitive resin composition film has a cover film, the cover film is peeled off, and the photosensitive resin composition film and the substrate are laminated together by thermocompression such that the former and the latter are opposite to each other. Thermocompression can be performed by a heat press process, a heat lamination process, a heat vacuum lamination process or the like. The laminating temperature is preferably not lower than 40° C. from the viewpoint of conformability to raised and recessed portions of the substrate. The laminating temperature is preferably not higher than 150° C. for preventing deterioration of the pattern resolution due to curing of the photosensitive resin composition film at the time of laminating.

Examples of the substrate include, but are not limited to, a silicon wafer, a ceramic, gallium arsenide, an organic circuit substrate, an inorganic circuit substrate, and these substrates on which circuit constituent materials are placed. Examples of the organic circuit substrate include glass base copper-clad laminates such as a glass fabric/epoxy copper-clad laminate, composite copper-clad laminates such as a glass nonwoven fabric/epoxy copper-clad laminate, heat-resistant/thermoplastic substrates such as a polyether imide resin substrate, a polyether ketone resin substrate and a polysulfone-based resin substrate, and flexible substrates such as a polyester copper-clad film substrate and a polyimide copper-clad film substrate. Examples of the inorganic circuit substrate include ceramic substrates such as an aluminum substrate, an aluminum nitride substrate and a silicon carbide substrate, and metal-based substrates such as an aluminum base substrate and an iron base substrate. Examples of the circuit constituent material include conductors containing metals such as silver, gold, copper and aluminum, resistors containing an inorganic oxide and so on, low dielectric materials containing a glass-based material and/or a resin and so on, high dielectric materials containing a resin, inorganic particles having a high dielectric constant, and so on, and insulators containing a glass-based material and so on.

Next, the photosensitive resin composition coating formed by the above-mentioned method is irradiated with exposure light through a mask having a predetermined pattern to perform exposure. As an exposure light source, an i-line (365 nm), an h-line (405 nm) and a g-line (436 nm) of a mercury lamp are preferably used. The photosensitive resin composition film may be exposed without peeling off the support from the photosensitive resin composition film if the support is a material that is transparent to these rays. As exposure equipment, a stepper type exposure system or a mask aligner, a mirror projection type exposure system or the like can be used.

For forming a pattern, exposed areas are removed with a developer after exposure. The developer is preferably an aqueous solution of tetramethyl ammonium hydroxide, or an aqueous solution of an alkaline compound such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethylmethacrylate, cyclohexylamine, ethylenediamine or hexamethylenediamine. In some cases, one of polar solvents such as N-methyl-2-pyrrolidone, N,N-dimethylformamide, N,N-dimethylacetamide, dimethylsulfoxide, γ-butyrolactone and dimethylacrylamide, alcohols such as methanol, ethanol and isopropanol, esters such as ethyl lactate and propylene glycol monomethyl ether acetate, and ketones such as cyclopentanone, cyclohexanone, isobutyl ketone and methyl isobutyl ketone, or a combination of several kinds thereof may be included in the aforementioned aqueous alkali solution.

Development can be performed by a method in which the developer is sprayed to the surface of the coating, a method in which the developer is deposited on the surface of the coating, a method in which the film is immersed in the developer, a method in which the film is immersed and subjected to ultrasonication, or the like. Development conditions such as the development time, the development step and the temperature of the developer should be conditions which ensure that exposed areas can be removed to form a pattern.

The developer is preferably rinsed with water after development. The developer may be rinsed with water plus an alcohol such as ethanol or isopropyl alcohol, an ester such as ethyl lactate or propylene glycol monomethyl ether acetate, or the like.

A baking treatment may be carried out as necessary before development. Consequently, the resolution of the pattern after development is improved, or the allowable range of development conditions is increased in some cases. The temperature of the baking treatment is preferably in a range of 50 to 180° C., more preferably in a range of 60 to 120° C. in particular. The time is preferably 5 seconds to several hours.

After formation of a pattern, a quinonediazide compound remains in the photosensitive resin composition coating. Therefore, the compound may be thermally decomposed to produce nitrogen at the time of thermodecompression or curing. For prevention thereof, the entire surface of the photosensitive resin composition coating after formation of a pattern is preferably irradiated with the above-mentioned exposure light to decompose the quinonediazide compound beforehand. This process is referred to as bleaching exposure.

After formation of a pattern or bleaching exposure, the photosensitive resin composition coating is dried by heating at a temperature in a range of 60 to 200° C. for reducing a solvent, a volatile component, water, nitrogen and so on that remain in the photosensitive resin composition coating. The time is preferably one minute to several hours.

The substrate provided with the photosensitive resin composition coating, on which a pattern is formed, is thermally compressed on a substrate or any other member to be temporarily fixed. The thermocompression temperature is preferably in a temperature range of 100 to 150° C. The pressure during thermocompression is preferably in a range of 0.01 to 10 MPa. The time is preferably one second to several minutes. Thermocompression may be performed under normal pressure, or may be performed in vacuum for prevention of trapping of air bubbles and so on.

After thermocompression, the photosensitive resin composition coating is formed into a cured film by heating at a temperature of 120° C. to 400° C. For this heating treatment, a temperature is selected and elevated stepwise, or a certain temperature range is selected, and the temperature is continuously elevated for 5 minutes to 5 hours. As one example, the heat treatment is carried out at 130° C. and 200° C. for 30 minutes for each temperature. Alternatively, mention is made of a method in which the temperature is linearly elevated from room temperature to 250° C. for 2 hours. At this time, the heating temperature is preferably 150° C. to 300° C. inclusive, and further preferably 180° C. to 250° C. inclusive. The heating treatment may be performed under normal pressure, or may be performed in vacuum.

The adhesion strength of the bonded object after curing is preferably not less than 30 MPa from the viewpoint of adhesion reliability. More preferable is no less than 45 MPa.

The film thickness of the cured film can be arbitrarily set, but is preferably 0.5 μm to 80 μm inclusive.

A semiconductor device having a photosensitive resin composition cured film will now be described as an application of the photosensitive resin composition and the photosensitive resin composition film of the present invention. In recent years, semiconductor devices of various structures have been proposed, and the application of the photosensitive resin composition of the present invention is not limited to those described below.

The photosensitive resin composition and the photosensitive resin composition film of the present invention can be suitably used as an adhesive for a semiconductor for bonding, fixing and sealing a semiconductor element, a semiconductor device, a circuit substrate and a metal wiring material. The photosensitive resin composition and the photosensitive resin composition film of the present invention can also be used as an insulating film for a semiconductor element, a semiconductor device, a circuit substrate and so on. The semiconductor device in the present invention refers to not just a product prepared by bonding a semiconductor element to a substrate, and a product prepared by bonding semiconductor elements or bonding substrates, but also refers to all devices that can function by utilizing the properties of semiconductor elements, and electro-optic devices, semiconductor circuit substrates and electronic components including them are all encompassed in the semiconductor device.

One example of the method for producing a semiconductor device using the photosensitive resin composition and the photosensitive resin composition film of the present invention is as follows. A first circuit member having a first jointing terminal and a second circuit member having a second jointing terminal are placed such that the first jointing terminal and the second jointing terminal are opposite to each other. Next, the photosensitive resin composition film of the present invention is interposed between the first jointing terminal and the second jointing terminal placed opposite to each other to form a photosensitive resin composition coating. Alternatively, a varnish of the photosensitive resin composition is applied to any one or both of the surface of the first jointing terminal and the second jointing terminal, and dried to thereby form a photosensitive resin composition coating. Next, the photosensitive resin composition coating is patterned to open an area where conduction should be provided between the first jointing terminal and the second jointing terminal. Thereafter, the first circuit member and the second circuit member are heated and compressed to electrically connect these circuit members.

Electrical connection may be performed after first forming the photosensitive resin composition coating on the surface of only any one of the circuit members at the jointing terminal side, or may be performed after forming the photosensitive resin composition coating on the surfaces of both the first and second circuit members at the jointing terminal side. A through electrode may be formed on the first circuit member and/or the second circuit member, and the jointing terminal may be formed on one surface and/or both the surfaces of the member. As such as circuit member, a chip component such a semiconductor chip provided with bumps such as a plated bump and a stud bump, a chip Resistor or a chip condenser, a semiconductor chip having a TSV (through silicon via) electrode, or a silicon interposer, a substrate such as a glass epoxy circuit substrate or a film circuit substrate, or the like is used. A semiconductor device with circuit members laminated three-dimensionally is obtained by repeatedly performing such connection as described above using circuit members having jointing terminals on both the surfaces.

In the above-mentioned method for producing a semiconductor device, by using the photosensitive resin composition and the photosensitive resin composition film of the present invention, there can be obtained a semiconductor device in which the edge of an adhesive after curing is located at the inner side as compared to the edge of a circuit member, i.e. a semiconductor device in which occurrence of protrusion of an adhesive (fillet) to the outer periphery of circuit members is suppressed after a first circuit member and a second circuit member are heated and compressed. By suppressing occurrence of the fillet, the mounting area of the semiconductor device can be reduced, thus helping make the semiconductor device lighter, thinner and more compact. Even if the photosensitive resin composition of the present invention is not used, occurrence of the fillet can be suppressed as described above by ensuring that a resin composition coating is not formed at the peripheral part of the circuit member beforehand. In this method, however, alignment is difficult, and further it is very difficult to form a resin composition coating at a specific location when the composition is processed into a sheet of wafer. In contrast, in the method which uses the photosensitive resin composition and the photosensitive resin composition film of the present invention, a semiconductor device in which occurrence of the fillet is suppressed can be easily obtained by removing a photosensitive resin composition coating at the peripheral part of the circuit member by patterning.

One example of the method for producing a semiconductor device in which occurrence of the fillet is suppressed is as follows. A photosensitive resin composition coating is formed between a first circuit member and a second circuit member in the same manner as in the above-mentioned method for producing a semiconductor device. Next, the photosensitive resin composition coating at the peripheral part of the first circuit member and/or the second circuit member is removed by patterning the photosensitive resin composition coating. Thereafter, the first circuit member and the second circuit member are heated and compressed to bond these circuit members. As a result, there is obtained a semiconductor device in which a cured product of the photosensitive resin composition coating does not protrude from the first circuit member and the second circuit member.

As another application, on a silicon wafer provided with a CCD or CMOS image sensor consisting of a photodiode or a color filter and a micro lens array, a photosensitive resin composition film is attached, or a varnish of a photosensitive resin composition is applied and dried to thereby form a photosensitive resin composition coating. The photosensitive resin composition coating is patterned, and then a glass substrate is laminated on a left pattern as a support substrate, and thermally compressed. The laminate is heated to cure the photosensitive resin composition coating. In this way, there is obtained an image sensor having a hollow structure, wherein a semiconductor element and a glass substrate are bonded with a cured product of the patterned photosensitive resin composition coating as a barrier wall.

EXAMPLES

A method for preparing a photosensitive resin composition of the present invention and a method for producing a photosensitive resin composition sheet, and a method for evaluating the properties thereof and the results will be described more specifically below, but the present invention is not limited thereto.

<Molecular Weight of Synthesized Polyimide>

A polyimide was dissolved in NMP to prepare a solution having a solid concentration of 0.1% by weight, and a weight average molecular weight was calculated in terms of polystyrene by a GPC apparatus Waters 2690 (manufactured by Waters Co., Ltd.) having a configuration shown below. For GPC measurement conditions, the mobile layer was NMP with LiCl and phosphoric acid each dissolved therein at a concentration of 0.05 mol/L, and the development rate was 0.4 ml/minute. The column was warmed to 40° C. using a column oven.
Detector: Waters 996
System controller: Waters 2690
Column: TOSOH TSK-GEL α-4000
Column: TOSOH TSK-GEL α-2500

<Imidization Ratio of Synthesized Polyimide>

First, the infrared spectrum of a polyimide was measured, and the presence of absorption peaks (around 1780 cm$^{-1}$ and around 1377 cm$^{-1}$) originating from an imide structure in the polyimide was confirmed. Next, the polyimide was subjected to a heat treatment at 350° C. for an hour, the infrared spectrum is then measured again, and peak intensities around 1377 cm$^{-1}$ before and after the heat treatment were compared. The imidization ratio of the polyimide before the heat treatment was determined with the imidization ratio of the polyimide after the heat treatment set to 100%.

<Spin Coating of Photosensitive Resin Composition>

A photosensitive resin composition prepared in each of Examples and Comparative Examples was applied by spin coating onto a silicon wafer using a spin coater. The rotation time was 10 seconds, and the number of rotations was adjusted to about 500 to 700 rpm so that the film thickness after drying was about 25 μm. The photosensitive resin composition was dried for 3 minutes on a hot plate at 100° C. after being applied.

<Lamination of Photosensitive Resin Composition Film>

A cover film of a photosensitive resin composition film prepared in each of Examples and Comparative Examples was peeled off, the peeled surface was laminated onto a silicon wafer under conditions of stage temperature: 80° C.; roll temperature: 80° C.; degree of vacuum: 150 Pa; attaching rate: 5 mm/second; and attaching pressure: 0.2 Mpa using a lamination apparatus (VTM-200M manufactured by Takatori Corporation), and a support film was peeled off.

<Evaluation of Resolution of Photosensitive Resin Composition>

A silicon wafer after spin coating or lamination was pattern-exposed using a mask having a pattern of L/S=70/70, 60/60, 50/50, 40/40, 30/30, 25/25 and 20/20 μm. The exposure gap between the mask and the photosensitive resin composition film was 100 μm, and L39 filter transmitted light from an ultra-high pressure mercury lamp was applied in an amount of 400 mJ/cm$^2$ (photometric value in an h-line). After pattern exposure, exposed areas were removed using a 2.38% aqueous solution of tetramethylammonium hydroxide in dip development, and rinsing was carried out with water. The development time was 1.5 times as long as the time taken for exposed areas to be fully dissolved. The obtained pattern was observed with an optical microscope, and a minimum size with defects such as clogging being absent in lines of the pattern was evaluated as a resolution.

<Evaluation of Heat Resistance>

A photosensitive resin composition laminated or applied by spin coating onto a silicon wafer was exposed in an exposure amount of 1000 mJ/cm$^2$ (photometric value in an i-line) using an ultra-high pressure mercury lamp in the manner described above, and then heat-treated under an atmosphere of N$_2$ at 200° C. for 60 minutes in an inert oven (INL-60 manufactured by Koyo Thermo Systems Co., Ltd.) to obtain a cured film. The obtained cured film on the silicon wafer was immersed in 47% hydrofluoric acid at room temperature for 7 minutes, and then washed with tap water, and the cured film was peeled off from the silicon wafer. For the peeled cured film, a thermal weight loss was measured under a condition of temperature elevation rate: 10° C. under a nitrogen atmosphere using an apparatus for thermogravimetry (TG/DTA 6200 manufactured by SII NanoTechnology Inc.), and a temperature at which the weight loss was 1% with respect to a weight at the start of measurement was designated as an indicator of the heat resistance.

<Evaluation of Adhesion Strength>

A photosensitive resin composition laminated or applied by spin coating onto a silicon wafer was exposed in an exposure amount of 400 mJ/cm$^2$ (photometric value in an h-line) in the manner as described above. The silicon wafer after exposure was cut into 50×50 mm, placed on a hot plate at 150° C. with the photosensitive resin composition film at the upper side, and preliminarily heated for one minute, and a silicon chip (2×2 mm, thickness: 525 μm) was then thermally compressed at a pressure of 0.2 MPa for 30 seconds to be temporarily fixed. Thereafter, heat curing was performed at 250° C. for 60 minutes using an inert oven under a nitrogen atmosphere to obtain a sample with a silicon chip bonded to a silicon wafer with the photosensitive resin composition interposed therebetween. The shear strength of the silicon chip of the sample was measured under the following conditions, and designated as an adhesion strength.
Apparatus: Die shear Tester Series 4000 manufactured by Dage Corporation
Measurement temperature: 30° C.
Sample size: 2 mm×2 mm
Test speed: 200 μm/s
Test height: 300 μm <Evaluation of Stress>

A measurement was made in the following procedure using a stress measurement apparatus FLX-2908 manufactured by KLA-Tencor Corporation. First, a warp of a 6-inch silicon wafer was measured by a stress measurement apparatus and to this wafer, the photosensitive resin composition film was laminated or the photosensitive resin composition was applied by spin coating. This silicon wafer was exposed in an exposure amount of 1000 mJ/cm$^2$ (photometric value in an i-line) using an ultra-high pressure mercury lamp, and then heat-treated under an atmosphere of N$_2$ at 200° C. for 60 minutes in an inert oven (INL-60 manufactured by Koyo Thermo Systems Co., Ltd.) to obtain a cured film. A warp of the substrate after curing was measured by the stress measurement apparatus again, and a stress at room temperature was calculated from warps of the wafer before and after formation of the cured film.

A polyimide and a quinolinediazide compound used in each of Examples and Comparative Examples were synthesized by the following method.

Synthesis Example 1

To 100 g of N-methyl-2-pyrrolidone (NMP) were dissolved 16. 41 g (0.082 mol) of 4,4'-diaminodiphenyl ether (4,4'-DAE), 1.24 g (0.005 mol) of 1,3-bis(3-aminopropyl)tetramethyldisiloxane (SiDA) and 2.73 g (0.025 mol) of 3-aminophenol (MAP) as an end capping agent under a dry nitrogen stream. Thereto was added 31.02 g (0.1 mol) of 4,4'-oxydiphthalic dianhydride (ODPA) together with 30 g of NMP, and the mixture was stirred at 20° C. for an hour, and then stirred at 50° C. for 4 hours. Thereafter, the mixture was stirred at 180° C. for 5 hours to obtain a resin solution. Next, the resin solution was poured in 3 L of water to collect white precipitates. The precipitates were collected by filtration, washed with water three times, and then dried in a vacuum dryer at 80° C. for 5 hours to obtain polyimide A. The imidization ratio of the obtained resin powder was 95%.

Synthesis Example 2

To 100 g of NMP were dissolved 30.95 g (0.0845 mol) of 2,2-bis(3-amino-4-hydroxyphenyl) hexafluoropropane (BAHF) and 1.24 g (0.005 mol) of SiDA under a dry nitrogen stream. Thereto was added 31.02 g (0.1 mol) of ODPA together with 30 g of NMP, and the mixture was stirred at 20° C. for an hour, and then stirred at 50° C. for 4 hours. Thereto was added 2.5 g (0.02 mol) of MAP, and the mixture was stirred at 50° C. for 2 hours, and then stirred at 180° C. for 5 hours to obtain a resin solution. Next, the resin solution was poured in 3 L of water to collect white precipitates. The precipitates were collected by filtration, washed with water three times, and then dried in a vacuum dryer at 80° C. for 5 hours to obtain polyimide B. The imidization ratio of the obtained resin powder was 94%.

Synthesis Example 3

To 100 g of NMP were dissolved 30.03 g (0.082 mol) of BAHF, 1.24 g (0.005 mol) of SiDA and 3.13 g (0.025 mol) of 4-aminothiophenol as an end capping agent under a dry nitrogen stream. Thereto was added 29.42 g (0.1 mol) of 3,3',4,4'-biphenyltetracarboxylic dianhydride (BPDA) together with 30 g of NMP, and the mixture was stirred at 20° C. for an hour, and then stirred at 50° C. for 4 hours. Thereafter, the mixture was stirred at 180° C. for 5 hours to obtain a resin solution. Next, the resin solution was poured in 3 L of water to collect white precipitates. The precipitates were collected by filtration, washed with water three times, and then dried in a vacuum dryer at 80° C. for 5 hours to obtain polyimide C. The imidization ratio of the obtained resin powder was 94%.

Synthesis Example 4

To 100 g of NMP were dissolved 30.03 g (0.082 mol) of BAHF, 1.24 g (0.005 mol) of SiDA and 4.1 g (0.025 mol) of 3-hydroxyphthalic anhydride as an end capping agent under a dry nitrogen stream. Thereto was added 31.02 g (0.1 mol) of ODPA together with 30 g of NMP, and the mixture was stirred at 20° C. for an hour, and then stirred at 50° C. for 4 hours. Thereafter, the mixture was stirred at 180° C. for 5 hours. After completion of stirring, the solution was poured in 3 L of water to obtain white precipitates. The precipitates were collected by filtration, washed with water three times, and then dried in a vacuum dryer at 80° C. for 5 hours to obtain polyimide D. The imidization ratio of the obtained polymer powder was 96%.

Synthesis Example 5

To 80 g of NMP were dissolved 17.60 g (0.088 mol) of 4,4-DAE, 1.24 g (0.005 mol) of SiDA and 1.64 g (0.015 mol) of MAP as an end capping agent. Thereto was added 31.02 g (0.1 mol) of ODPA together with 20 g of NMP, and the mixture was stirred at 20° C. for an hour, and then stirred at 50° C. for 4 hours. Thereafter, 15 g of xylene was added, and the mixture was stirred at 180° C. for 5 hours while water was boiled with xylene. After completion of stirring, the solution was poured in 3 L of water to obtain white precipitates. The precipitates were collected by filtration, washed with water three times, and then dried in a vacuum dryer at 80° C. for 20 hours to obtain polyimide E. The imidization ratio of the obtained polymer powder was Synthesis Example 6

To 120 g of NMP were dissolved 16.40 g (0.082 mol) of 4'4-DAE, 1.24 g (0.005 mol) of SiDA and 1.64 g (0.025 mol) of MAP as an end capping agent under a dry nitrogen stream. Thereto was added 31.02 g (0.1 mol) of ODPA together with 30 g of NMP, and the mixture was stirred at 20° C. for an hour, and then stirred at 50° C. for 4 hours. Thereafter, the mixture was stirred at 180° C. for 5 hours to obtain a resin solution. Next, the resin solution was poured in 3 L of water to collect white precipitates. The precipitates were collected by filtration, washed with water three times, and then dried in a vacuum dryer at 80° C. for 5 hours to obtain polyimide F. The imidization ratio of the obtained resin powder was 95%.

Synthesis Example 7

To 100 g of N-methyl-2-pyrrolidone (NMP) were dissolved 16.41 g (0.082 mol) of 4,4'-diaminodiphenyl ether (4,4'-DAE), 1.24 g (0.005 mol) of 1,3-bis(3-aminopropyl) tetramethyldisiloxane (SiDA) and 2.73 g (0.025 mol) of 3-aminophenol (MAP) as an end capping agent under a dry nitrogen stream. Thereto was added 31.02 g (0.1 mol) of 4,4'-oxydiphthalic dianhydride (ODPA) together with 30 g of NMP, and the mixture was stirred at 20° C. for an hour, and then stirred at 50° C. for 4 hours. Thereafter, the mixture was stirred at 180° C. for 2.5 hours to obtain a resin solution. Next, the resin solution was poured in 3 L of water to collect white precipitates. The precipitates were collected by filtration, washed with water three times, and then dried in a vacuum dryer at 80° C. for 3 hours to obtain polyimide G. The imidization ratio of the obtained resin powder was 83%.

Synthesis Example 8

To 80 g of NMP were dissolved 11.41 g (0.057 mol) of 4,4'-DAE, 1.24 g (0.005 mol) of SiDA and 6.98 g (0.075 mol) of aniline as an end capping agent. Thereto was added 31.02 g (0.1 mol) of ODPA together with 20 g of NMP, and the mixture was stirred at 20° C. for an hour, and then stirred at 50° C. for 4 hours. Thereafter, the mixture was stirred at 180° C. for 5 hours to obtain a resin solution. Next, the resin solution was poured in 3 L of water to collect white precipitates. The precipitates were collected by filtration, washed with water three times, and then dried in a vacuum dryer at 80° C. for 5 hours to obtain polyimide H. The imidization ratio of the obtained resin powder was 95%.

Synthesis Example 9

To 450 g of 1,4-dioxane were dissolved 21.22 g (0.05 mol) of TrisP-PA (product name; manufactured by Honshu Chemical Industry Co., Ltd.) and 26.8 g (0.1 mol) of 5-naphthoquinonediazidesulfonic acid chloride (NAC-5 manufactured by Toyo Gosei CO. Ltd.) under a dry nitrogen stream, and the solution was adjusted to room temperature. Thereto was added dropwise 12.65 g of triethylamine mixed with 50 g of 1,4-dioxane while ensuring that the temperature in the system was not 35° C. or higher. Thereafter, the mixture was stirred at 40° C. for 2 hours. A triethylamine salt was filtered, and the filtrate was poured in water. Thereafter, deposited precipitates were collected by filtration, and further washed with 1 L of 1% aqueous hydrochloric acid. Thereafter, the precipitates were further washed with 2 L of water twice. The precipitates were dried in a vacuum dryer to obtain quinonediazide compound A represented by the following formula.

[Chemical Formula 7]

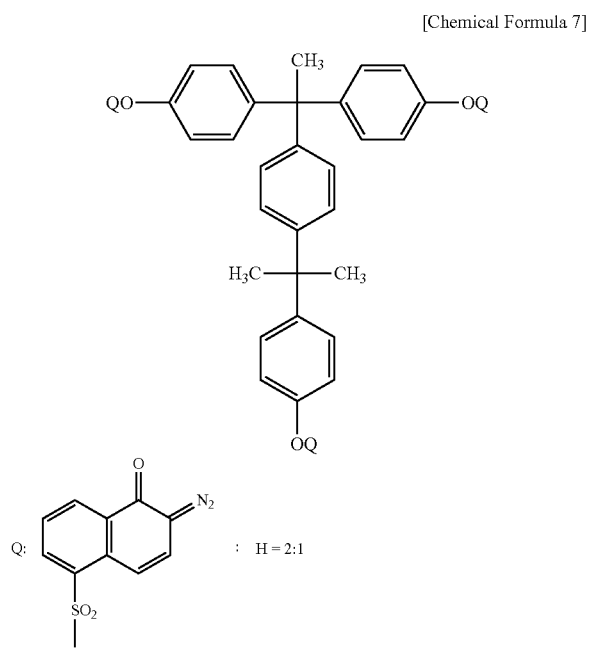

Synthesis Example 10

To 450 g of 1,4-dioxane were dissolved 12.25 g (0.04 mol) of Phcc-AP (product name; manufactured by Honshu Chemical Industry Co., Ltd.) and 26.8 g (0.1 mol) of 5-naphthoquinonediazidesulfonic acid chloride (NAC-5 manufactured by Toyo Gosei CO. Ltd.) under a dry nitrogen stream, and the solution was adjusted to room temperature. Thereto was added dropwise 12.65 g of triethylamine mixed with 50 g of 1,4-dioxane while ensuring that the temperature in the system was not 35° C. or higher. Thereafter, the mixture was stirred at 40° C. for 2 hours. A triethylamine salt was filtered, and the filtrate was poured in water. Thereafter, deposited precipitates were collected by filtration, and further washed with 1 L of 1% aqueous hydrochloric acid. Thereafter, the precipitates were further washed with 2 L of water twice. The precipitates were dried in a vacuum dryer to obtain quinonediazide compound B represented by the following formula.

[Chemical Formula 8]

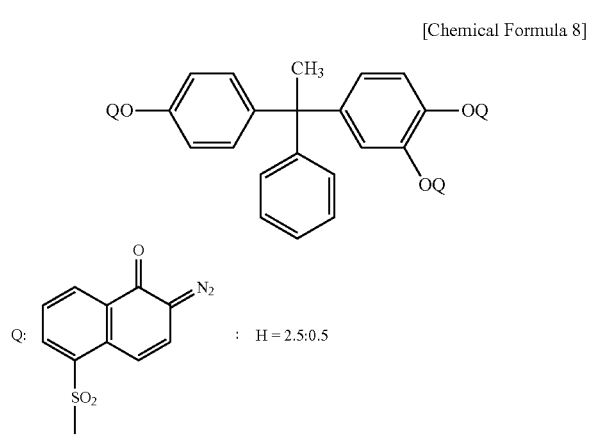

Synthesis Example 11

To 450 g of 1,4-dioxane were dissolved 12.78 g (0.056 mol) of bisphenol A and 26.8 g (0.1 mol) of 5-naphthoquinonediazidesulfonic acid chloride (NAC-5 manufactured by Toyo Gosei CO. Ltd.) under a dry nitrogen stream, and the solution was adjusted to room temperature. Thereto was added dropwise 12.65 g of triethylamine mixed with 50 g of 1,4-dioxane while ensuring that the temperature in the system was not 35° C. or higher. Thereafter, the mixture was stirred at 40° C. for 2 hours. A triethylamine salt was filtered, and the filtrate was poured in water. Thereafter, deposited precipitates were collected by filtration, and further washed with 1 L of 1% aqueous hydrochloric acid. Thereafter, the precipitates were further washed with 2 L of water twice. The precipitates were dried in a vacuum dryer to obtain quinonediazide compound C represented by the following formula.

[Chemical Formula 9]

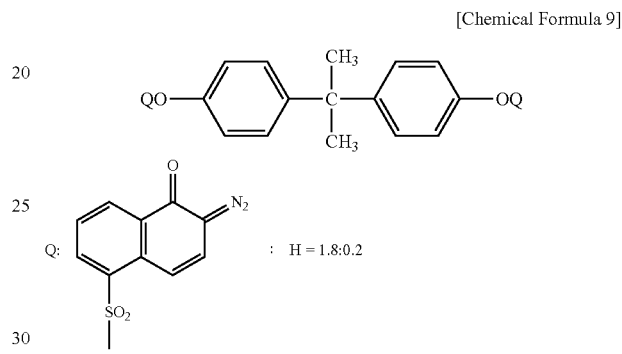

Synthesis Example 12

To a 500 ml flask were placed 5 g of 2,2'-azobis(isobutyronitrile), 5 g of t-dodecanethiol and 150 g of propylene glycol monomethyl ether acetate (hereinafter abbreviated as PGMEA). Thereafter, 30 g of methacrylic acid, 35 g of benzyl methacrylate and 35 g of octahydro-1H-4,7-methanoindene-5-yl methacrylate were placed, and the mixture was stirred at room temperature for some time, air in the flask was replaced by nitrogen, and the mixture was then stirred at 70° C. for 5 hours. Next, to the resulting solution were added 15 g of glycidyl methacrylate, 1 g of dimethylbenzylamine and 0.2 g of p-methoxyphenol, and the mixture was stirred at 90° C. for 4 hours to obtain an acrylic resin solution. The solid concentration of the obtained acrylic resin solution was 43% by weight, and the obtained resin had a weight average molecular weight (Mw) of 10600 and an acid value of 118 mg KOH/g.

Example 1

(a) 10 g of polyimide A obtained in Synthesis example 1, (b) 2.0 g of OXT-191 (product name; manufactured by Toagosei Co., Ltd.) and (c) 2.0 g of quinonediazide compound A were dissolved in a solvent that was diacetone alcohol/ethyl lactate in a ratio of 40/60. The added amount of the solvent was adjusted so that the solid concentration was 45% by weight with components other than the solvent being considered as solids. Thereafter, the solution was filtered under pressure using a filter with a retention particle diameter of 2 µm to obtain a photosensitive resin composition (Table 1).

The obtained photosensitive adhesive was applied onto a PET film having a thickness of 38 µm using a comma roll coater, and dried at 75° C. for 6 minutes, and a PP film having a thickness of 10 µm was then laminated as a cover film to obtain a photosensitive resin composition film. Coating was performed so that the film thickness of the photosensitive resin composition film was about 25 µm. The obtained photosensitive adhesive film was used to evaluate the resolution, the heat resistance, the adhesion strength and the stress in the manner described previously.

Examples 2 to 12

A photosensitive resin composition film was prepared in the mixing ratio shown in Table 1 in the same manner as in Example 1, and the resolution, the heat resistance, the adhesion strength and the stress were evaluated in the manner described previously.

Example 13

The photosensitive resin composition of Example 1 was applied by spin coating to a silicon wafer by the method described above to form a coated film. The obtained product was used to evaluate the resolution, the heat resistance, the adhesion strength and the stress.

Example 14

The photosensitive resin composition of Example 3 was applied by spin coating to a silicon wafer by the method described above to form a coated film. The obtained product was used to evaluate the resolution, the heat resistance, the adhesion strength and the stress.

Comparative Examples 1 to 3

A photosensitive resin composition film was prepared in the mixing ratio shown in Table 2 in the same manner as in Example 1, and the resolution, the heat resistance, the adhesion strength and the stress were evaluated in the manner described previously.

Reference Example 1

A photosensitive resin composition was prepared in accordance with the composition described in Table 2, and an attempt was made to form a photosensitive resin composition film in the same manner as in Example 1, but cracks occurred in a film state because the film was fragile, so that the resolution, the adhesion strength and the stress could not be evaluated. For the film after curing, only the heat resistance was evaluated.

Reference Example 2

The photosensitive resin composition of Reference Example 1 was applied by spin coating to a silicon wafer by the method described above to form a coated film. The obtained product was used to evaluate the resolution, the heat resistance, the adhesion strength and the stress.

Example 15

The photosensitive resin composition film obtained in Example 2 was laminated onto a copper comb Electrode of L/S=10 µm/10 µm by vacuum lamination. Thereafter, the coating of the electrode part was wiped off with acetone. Next, the laminate was exposed in an exposure amount of 1000 mJ/cm$^2$ (photometric value in an i-line) using an ultra-high pressure mercury lamp, and then heat-treated under an atmosphere of N$_2$ at 200° C. for 60 minutes in an inert oven to prepare a sample for evaluation. An insulation reliability test of 1000 hours was conducted by continuously applying a voltage of 50 V to between electrodes of the obtained sample for evaluation under an atmosphere of temperature: 85° C. and relative humidity: 85%. The resistance value was kept at $10^{10}\Omega$ up to 1000 hours, and therefore the sample was considered acceptable for the insulation reliability. For the copper comb Electrode, such an electrode was used that on a silicon wafer on which a thermal oxide film having a thickness of 0.4 µm was formed and a silicon nitride film having a thickness of 0.8 µm was formed thereon, a chromium ground electrode having a thickness of 0.08 µm was pattern-formed and a copper electrode having a thickness of 10 µm was pattern-formed thereon.

Example 16

This Example will be described with reference to FIG. 1. First, a Ni layer (10 nm) as an adhesive layer 101 was formed on a silicon wafer 100 and an electroless copper plated layer (10 µm) as a conductor layer 102 was formed thereon by sputtering.

Thereafter, the photosensitive adhesive varnish obtained in Example 2 was applied by spin coating onto the substrate using a spin coater, and dried to form a photosensitive resin composition coating. Thereafter, a via hole was formed in the photosensitive resin composition coating by exposure and development, and the photosensitive resin composition coating was cured by carrying out a heating treatment in an inert oven to obtain a substrate having a via hole layer 102 (FIG. 1 (a)).

Then, the photosensitive resin composition varnish obtained in Example 2 was applied by spin coating to the substrate using a spin coater, a pattern (space area) forming a wiring hole layer was formed by drying, exposure and development, and the wiring hole layer 103 was cured by carrying out a heating treatment in an inert oven to obtain a substrate having a via hole/wiring hole (FIG. 1 (b)).

Then, a Ni layer (thickness: 10 nm) as an adhesive layer was formed on the substrate by sputtering, and electrolytic copper plating was performed to fill the via hole and the wiring hole with copper plating. Thereafter, copper plating of unwanted areas were removed and the surface of an insulating film was flattened by chemical mechanical polishing (CMP) to obtain a substrate having a via layer/wiring layer 104 (FIG. 1 (c)).

Thereafter, with formation of a via layer/wiring layer by the above-mentioned method designated as one cycle, the cycle was repeated three times to prepare a multilayer wiring substrate having total 8 layers in which 4 via layers and 4 wiring layers were laminated. As a result of checking presence/absence of defects such as detachment and cracks of the insulating layer in the prepared multilayer wiring substrate, these defects were not observed. As a result of checking conduction between any outermost wiring layer and the undermost conductor layer in the prepared multilayer wiring substrate using a tester, it could be found that conduction was provided between wirings at any location and that no short circuit occurred between adjacent wirings.

Compounds (b) used in Examples and Comparative Examples are as follows.

jER828: BisA type epoxy compound (manufactured by Mitsubishi Chemical Corporation)

OXT-191: Oxetane compound (manufactured by Toagosei Co., Ltd.)

[Chemical Formula 10]

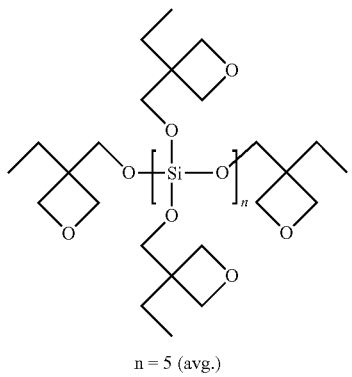

n = 5 (avg.)

EP4003S: Propylene oxide-modified BisA type epoxy resin (manufactured by ADEKA Corporation)

jER152: Phenol novolac epoxy resin (manufactured by Mitsubishi Chemical Corporation)

jER630: Glycidylamine type epoxy resin (manufactured by Mitsubishi Chemical Corporation)

NC3000: Biphenyl type epoxy resin (manufactured by Nippon Kayaku Co., Ltd.)

"EPICLON (registered trademark)" 850S: BisA type epoxy resin (manufactured by DIC Corporation)

TABLE 1

| Items | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Composition of polyimide (molar ratio) | Polyimide | | A | B | C | D | E | F | B | B | A | C |
| | Acid anhydride | ODPA | 100 | 100 | — | 100 | 100 | 100 | 100 | 100 | 100 | — |
| | | BPDA | — | — | 100 | — | — | — | — | — | — | 100 |
| | Diamine | BAHF | — | 84.5 | 82 | 82 | — | — | 84.5 | 84.5 | — | 82 |
| | | 4,4'-DAE | 82 | — | — | — | 88 | 82 | — | — | 82 | — |
| | | SiDA | 5 | 5 | 5 | 5 | 5 | 5 | 5 | 5 | 5 | 5 |
| | End capping agent | MAP | 25 | 20 | — | — | 15 | 25 | 20 | 20 | 25 | — |
| | | 4-aminothiophenol | — | — | 25 | — | — | — | — | — | — | 25 |
| | | 3-hydroxyphthalic acid | — | — | — | 25 | — | — | — | — | — | — |
| | | Aniline | — | — | — | — | — | — | — | — | — | — |
| Imidization ratio (%) of polyimide | | | 95 | 94 | 94 | 96 | 95 | 95 | 94 | 94 | 95 | 94 |
| Weight average molecular weight of polyimide | | | 19900 | 25600 | 21200 | 22500 | 56000 | 19900 | 25600 | 25600 | 19900 | 21200 |
| Photosensitive composition Composition (parts by weight) | Polyimide (a) | | 100 | 100 | 100 | 100 | 100 | 100 | 100 | 100 | 100 | 100 |
| | Compound (b) | jER828 | — | — | — | 20 | — | — | — | — | — | — |
| | | OXT-191 | 20 | — | — | — | — | — | 10 | — | 25 | — |
| | | EP4003S | — | 30 | 40 | — | — | — | 50 | — | — | 40 |
| | | jER152 | — | — | — | — | 40 | 20 | — | — | — | — |
| | | iER630 | — | 30 | — | — | 20 | — | — | 30 | — | — |
| | | NC3000 | — | — | — | 40 | — | — | — | — | — | — |
| | | EPICLON-850 | — | — | — | — | — | — | — | 30 | — | — |
| | Quinonediazide compound (c) | A | 20 | — | — | — | 40 | — | — | — | 7 | — |
| | | B | — | 10 | 20 | 5 | — | — | — | 30 | — | 20 |
| | | C | — | — | — | — | — | 20 | 45 | — | — | — |
| | Others | Acrylic resin solution of Synthesis Example 10 | — | — | — | — | — | — | — | — | — | 5 |
| Resolution (μm) | | | 25 | 30 | 25 | 40 | 25 | 30 | 25 | 25 | 40 | 25 |
| Heat resistance (° C.) | | | 346 | 351 | 348 | 361 | 340 | 356 | 335 | 349 | 365 | 311 |
| Adhesion strength (MPa) | | | 32 | 48 | 40 | 41 | 49 | 31 | 45 | 51 | 36 | 30 |
| Stress (MPa) | | | 26 | 19 | 20 | 20 | 18 | 24 | 17 | 18 | 25 | 29 |

TABLE 2

| Items | | | Example 11 | Example 12 | Example 13 | Example 14 | Comparative Example 1 | Comparative Example 2 | Comparative Example 3 | Reference Example 1 | Reference Example 2 |
|---|---|---|---|---|---|---|---|---|---|---|---|
| Composition of polyimide (molar ratio) | Polyimide | | G | C | A | C | H | A | B | A | A |
| | Acid anhydride | ODPA | 100 | — | 100 | — | 100 | 100 | 100 | 100 | 100 |
| | | BPDA | — | 100 | — | 100 | — | — | — | — | — |
| | Diamine | BAHF | — | 82 | — | 82 | — | — | 84.5 | — | — |
| | | 4,4'-DAE | 82 | — | 82 | — | 57 | 82 | — | 82 | 82 |
| | | SiDA | 5 | 5 | 5 | 5 | 5 | 5 | 5 | 5 | 5 |
| | End capping agent | MAP | 25 | — | 25 | — | — | 25 | 20 | 25 | 25 |
| | | 4-aminothiophenol | — | 25 | — | 25 | — | — | — | — | — |
| | | 3-hydroxyphthalic acid | — | — | — | — | — | — | — | — | — |

TABLE 2-continued

| Items | | | Example 11 | Example 12 | Example 13 | Example 14 | Comparative Example 1 | Comparative Example 2 | Comparative Example 3 | Reference Example 1 | Reference Example 2 |
|---|---|---|---|---|---|---|---|---|---|---|---|
| | Aniline | | — | — | — | — | 75 | — | — | — | — |
| Imidization ratio (%) of polyimide | | | 83 | 94 | 95 | 94 | 95 | 95 | 94 | 95 | 95 |
| Weight average molecular weight of polyimide | | | 18700 | 21200 | 19900 | 21200 | 11000 | 19900 | 25600 | 19900 | 19900 |
| Photosensitive composition Composition (parts by weight) | Polyimide (a) | | 100 | 100 | 100 | 100 | 100 | 100 | 100 | 100 | 100 |
| | Compound (b) | jER828 | — | — | — | — | — | 15 | — | — | — |
| | | OXT-191 | 20 | — | 20 | — | — | — | — | — | — |
| | | EP4003S | — | 20 | — | 40 | 10 | — | 10 | 40 | 40 |
| | | jER152 | — | — | — | — | — | — | — | — | — |
| | | jER630 | — | — | — | — | — | — | — | — | — |
| | | NC3000 | — | — | — | — | — | — | — | — | — |
| | | EPICLON-850 | — | — | — | — | — | — | — | — | — |
| | Quinonediazide compound (c) | A | 20 | — | 20 | — | — | 20 | — | — | — |
| | | B | — | 20 | — | 20 | 20 | — | 10 | 20 | 20 |
| | | C | — | — | — | — | — | — | — | — | — |
| | Others | Acrylic resin solution of Synthesis Example 10 | — | — | — | — | — | — | — | 12 | 12 |
| Resolution (μm) | | | 30 | 40 | 25 | 25 | 70 | 50 | 40 | Evaluation impossible | 40 |
| Heat resistance (° C.) | | | 308 | 353 | 346 | 348 | 353 | 346 | 350 | 264 | 264 |
| Adhesion strength (MPa) | | | 31 | 34 | 32 | 40 | 14 | 12 | 19 | Evaluation impossible | 21 |
| Stress (MPa) | | | 30 | 26 | 25 | 20 | 32 | 31 | 32 | Evaluation impossible | 25 |

According to the present invention, there is obtained a photosensitive resin composition and a photosensitive resin composition film, each of which is capable of forming a positive tone pattern by photolithography, has small stress after curing, and exhibits a high strength of adhesion with a semiconductor element and a support member.

DESCRIPTION OF REFERENCE SIGNS

100 silicon wafer
101 adhesive layer
102 conductor layer
103 via hole layer
104 wiring hole layer
105 via layer/wiring layer

The invention claimed is:

1. A photosensitive resin composition comprising: (a) an alkali-soluble polyimide which has a structural unit represented by general formula (1), while having a structure represented by general formula (2) and/or (3) at least one end of the main chain; (b) at least one compound selected from a bisphenol A-type epoxy compound, a novolac-type epoxy compound, a biphenyl-type epoxy compound and a glycidyl amine-type epoxy compound; and (c) a quinonediazide compound, wherein the content of the compound (b) is not less than 20 parts by weight per 100 parts by weight of the polyimide (a)

[Chemical Formula 1]

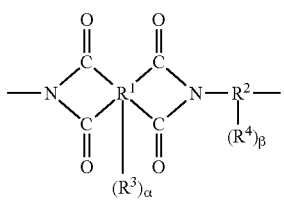

(1)

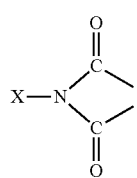

(2)

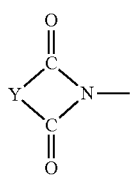

(3)

wherein X is derived from a primary monoamine which is an end capping agent and represents a monovalent organic group having at least one selected from the group consisting of a carboxyl group, a phenolic hydroxyl group, a sulfonic acid group and a thiol group, and Y is derived from a dicarboxylic anhydride which is an end capping agent and represents a divalent organic group having at least one selected from the group consisting of a carboxyl group, a phenolic hydroxyl group, a sulfonic acid group and a thiol group; and wherein $R^1$ represents a tetra- to tetradeca-valent organic group, $R^2$ represents a di- to dodeca-valent organic group, and $R^3$ and $R^4$ each independently represents at least one group selected from the group consisting of a carboxyl group, a phenolic hydroxyl group, a sulfonic acid group and a thiol group, $\alpha$ and $\beta$ each independently represents an integer of 0 to 10.

2. The photosensitive resin composition according to claim 1, wherein the compound (b) is a compound having two or more epoxy groups.

3. The photosensitive resin composition according to claim 1 or 2, wherein the imidization ratio of the polyimide (a) is not less than 90%.

4. The photosensitive resin composition according to claim 1, wherein the content of the compound (b) is not less than 40 parts by weight per 100 parts by weight of the polyimide (a).

5. The photosensitive resin composition according to claim 1, wherein the content of an acrylic resin contained is less than 10 parts by weight per 100 parts by weight of the polyimide (a).

6. A photosensitive resin composition film comprising: (a) an alkali-soluble polyimide which has a structural unit represented by general formula (1), while having a structure represented by general formula (2) and/or (3) at least one end of the main chain; (b) at least one compound selected from a bisphenol A-type epoxy compound, a novolac-type epoxy compound, a biphenyl-type epoxy compound and a glycidyl amine-type epoxy compound; and (c) a quinonediazide compound, wherein the content of the compound (b) is not less than 20 parts by weight per 100 parts by weight of the polyimide (a),

[Chemical Formula 2]

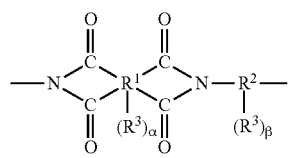

(1)

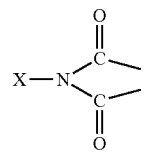

(2)

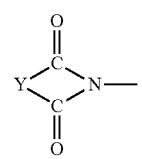

(3)

wherein X is derived from a primary monoamine which is an end capping agent and represents a monovalent organic group having at least one selected from the group consisting of a carboxyl group, a phenolic hydroxyl group, a sulfonic acid group and a thiol group, and Y is derived from a dicarboxylic anhydride which is an end capping agent and represents a divalent organic group having at least one selected from the group consisting of a carboxyl group, a phenolic hydroxyl group, a sulfonic acid group and a thiol group; and wherein $R^1$ represents a tetra- to tetradeca-valent organic group, $R^2$ represents a di- to dodeca-valent organic group, and $R^3$ and $R^4$ each independently represents at least one group selected from the group consisting of a carboxyl group, a phenolic hydroxyl group, a sulfonic acid group and a thiol group, $\alpha$ and $\beta$ each independently represents an integer of 0 to 10.

7. The photosensitive resin composition film according to claim 6, wherein the compound (b) has two or more epoxy groups in each molecule.

8. The photosensitive resin composition film according to claim 6 or 7, wherein the content of the compound (b) is not less than 40 parts by weight per 100 parts by weight of the polyimide (a).

9. The photosensitive resin composition film according to claim 6, wherein the content of an acrylic resin contained is less than 10 parts by weight per 100 parts by weight of the polyimide (a).

10. A laminate comprising a support, the photosensitive resin composition film according to claim 6, and a cover film in this order.

11. A cured product of the photosensitive resin composition according to claim 1 or of the photosensitive resin composition film according to claim 6.

12. A semiconductor device comprising a cured product of the photosensitive resin composition according to claim 1 or of the photosensitive resin composition film according to claim 6.

13. A semiconductor device comprising a cured product of the photosensitive resin composition according to claim 1 or of the photosensitive resin composition film according to claim 6 between circuit members, wherein the edge of the cured product is located at the inner side as compared to the edge of a circuit member.

14. A semiconductor device obtained by interposing the photosensitive resin composition according to claim 1 or the photosensitive resin composition film according to claim 6 between a first circuit member and a second circuit member, opening a desired area by patterning, and then electrically connecting the first circuit member and the second circuit member by heating and compression, wherein the edge of the photosensitive resin composition or the photosensitive resin composition film is located at the inner side as compared to the edges of the first circuit member and the second circuit member.

15. A method for producing a semiconductor device, wherein the photosensitive resin composition according to claim 1 or the photosensitive resin composition film according to claim 6 is interposed between a first circuit member and a second circuit member, and the first circuit member and the second circuit member are electrically connected by heating and compression.

* * * * *